United States Patent
Onishi

(10) Patent No.: US 7,041,524 B2
(45) Date of Patent: May 9, 2006

(54) SEMICONDUCTOR LASER DEVICE AND METHOD FOR FABRICATING THE SAME

(75) Inventor: Toshikazu Onishi, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/961,036

(22) Filed: Oct. 12, 2004

(65) Prior Publication Data

US 2005/0063443 A1 Mar. 24, 2005

Related U.S. Application Data

(62) Division of application No. 10/180,294, filed on Jun. 27, 2002, now Pat. No. 6,834,068.

(30) Foreign Application Priority Data

Jun. 29, 2001 (JP) .............................. 2001-198185

(51) Int. Cl.
*H01L 21/00* (2006.01)
(52) U.S. Cl. .............................. 438/41; 438/44; 438/46
(58) Field of Classification Search ............ 438/22–47, 438/479–509, 558–569
See application file for complete search history.

(56) References Cited

U.S. PATENT DOCUMENTS

| | | | |
|---|---|---|---|
| 4,318,059 A | 3/1982 | Lang et al. | |
| 4,426,704 A | 1/1984 | Nagai et al. | |
| 4,740,978 A | 4/1988 | Gobel et al. | |
| 4,747,110 A | 5/1988 | Takahashi et al. | |
| 4,817,110 A | 3/1989 | Tokuda et al. | |
| 5,177,757 A | 1/1993 | Tsugami | |
| 5,684,818 A | 11/1997 | Anayama et al. | |
| 5,799,027 A | 8/1998 | Anayama et al. | |
| 5,814,534 A | 9/1998 | Kimura et al. | |
| 5,815,522 A | 9/1998 | Nagai | |
| 5,882,948 A | 3/1999 | Jewell | |
| 5,946,336 A | 8/1999 | Mizutani et al. | |
| 5,999,553 A | 12/1999 | Sun | |
| 6,074,889 A * | 6/2000 | Sasaki ......................... | 438/46 |
| 6,377,598 B1 | 4/2002 | Watanabe et al. | |
| 6,526,083 B1 | 2/2003 | Kneissl et al. | |
| 6,539,040 B1 | 3/2003 | Anayama | |
| 6,590,918 B1 * | 7/2003 | Mannou et al. ................ | 372/45 |
| 6,614,817 B1 | 9/2003 | Nomura et al. | |
| 6,661,824 B1 | 12/2003 | Onishi | |
| 6,671,301 B1 * | 12/2003 | Onishi et al. .................. | 372/46 |
| 2001/0004114 A1 * | 6/2001 | Yuri ............................ | 257/94 |

FOREIGN PATENT DOCUMENTS

| | | |
|---|---|---|
| JP | 03-104292 | 5/1991 |
| JP | 3-104292 | 5/1991 |
| JP | 06-077594 | 3/1994 |

(Continued)

*Primary Examiner*—Savitri Mulpuri
(74) *Attorney, Agent, or Firm*—McDermott Will & Emery LLP

(57) ABSTRACT

A semiconductor laser device according to the present invention has a semiconductor substrate having a first region and a second region adjacent to the first region, a first active layer formed on the first region and made of a compound semiconductor, a first clad layer formed on the first active layer and made of a compound semiconductor containing a first dopant, and a second active region formed on the second region and made of a compound semiconductor containing a second dopant having a diffusion coefficient with respect to the first active region which is higher than that of the first dopant.

6 Claims, 11 Drawing Sheets

FOREIGN PATENT DOCUMENTS

| | | |
|---|---|---|
| JP | 09-219567 | 8/1997 |
| JP | 10-290043 | 10/1998 |
| JP | 10-335735 | 12/1998 |
| JP | 11-284280 | 10/1999 |
| JP | 11-312843 | 11/1999 |
| JP | 2001-077465 | 3/2001 |

* cited by examiner

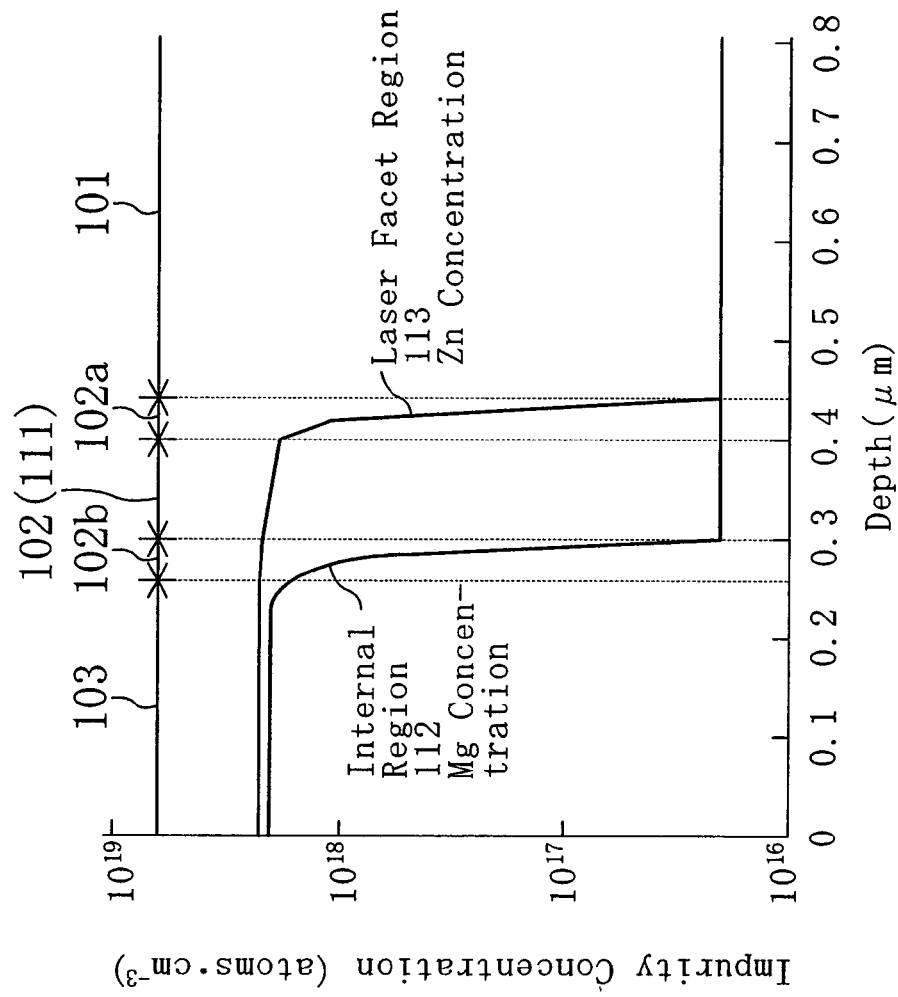

SEMICONDUCTOR LASER DEVICE AND METHOD FOR FABRICATING THE SAME

This application is a divisional of application Ser. No. 10/180,294 filed Jun. 27, 2002 now U.S. Pat. No. 6,834,068.

BACKGROUND OF THE INVENTION

The present invention relates to a semiconductor laser deice and to a method for fabricating the same. More particularly, it relates to an increase in the output of the semiconductor laser device.

Recent years have seen rapid widespread use of DVD (Digital Versatile Disk) devices in the fields of AV (Audio-Video) equipment, PCs (Personal Computers), and the like. In particular, great expectations have been placed on the use of recordable DVD devices (such as DVD-RAM and DVD-R) as large-capacity memory devices embedded in PCs and the like and as post-VTR (Video Tape Recorder) devices.

As pickup light sources for the foregoing DVD devices, red semiconductor lasers at wavelengths in the 650 nm band have been used. With the recent increases in the density and capacity of an optical disk, a pick-up light source capable of performing a particularly high output operation over 80 mw has been in growing demand to allow a higher-speed write operation with respect to the optical disk.

If a semiconductor laser device is increased in output, however, each of the laser facets of semiconductor laser device suffers catastrophic optical damage (hereinafter referred to as COD). The catastrophic optical damage is a degradation phenomenon caused by heat resulting from the absorption of a laser beam in the vicinity of the laser facet of the semiconductor laser device. The resulting heat degrades the portion of a semiconductor layer located in the vicinity of the laser facet. Specifically, the heat reduces the band gap of the portion of the semiconductor layer located in the vicinity of the laser facet and increases the absorption coefficient of the portion of the semiconductor layer located in the vicinity of the laser facet. Consequently, the laser beam is further absorbed in the vicinity of the laser facet.

It has been known that, in preventing COD, preliminary provision of a semiconductor layer having a large band gap and transparent to a laser beam emitted from the semiconductor laser device in a region located in the vicinity of each of the laser facets of the semiconductor laser device, i.e., the formation of a so-called window structure is effective. In particular, the formation of the window structure in a semiconductor laser device outputting a red laser beam exceeding 50 mW is inevitable to ensure the reliability of the semiconductor laser device in use.

Thus far, various methods have been proposed each for fabricating a semiconductor laser device having a window structure. One of the methods uses a phenomenon in which diffused Zn alloys a superlattice in an active layer. For example, Japanese Unexamined Patent Publication No. HEI 11-284280 discloses a method in which a window structure is formed by further forming a group III-V compound semiconductor layer containing Zn at a high concentration (hereinafter referred to as a Zn supply layer) over a region located in the vicinity of each of the laser facets of a semiconductor laser device, causing solid-phase diffusion of Zn from the Zn supply layer, and thereby disordering the active layer in the laser facet region. A method of using ZnO as a Zn diffusion source instead of the Zn supply layer is also disclosed in, e.g., Japanese Unexamined Patent Publication No. HEI 10-290043.

FIG. 10 is a perspective view showing a structure of a conventional semiconductor laser device.

As shown in FIG. 10, a conventional semiconductor laser device 70 has a structure (so-called window structure) comprising laser facet regions 713 and an internal region 712.

The internal region 712 has a multilayer structure composed of: an n-type clad layer 701 made of n-type AlGaInP; a guide layer 702a (with a thickness of 30 nm) made of AlGaInP; an active layer 702 made of a quantum well consisting of a plurality of GaInP layers and a plurality of AlGaInP layers; a guide layer 702b (with a thickness of 30 nm) made of AlGaInP; a first p-type clad layer 703 made of p-type AlGaInP containing Zn as a dopant; a current block layer 704 made of n-type AlGaInP; a second p-type clad layer 705 made of p-type AlGaInP containing Zn as a dopant; and a contact layer 706 made of p-type GaAs containing Zn as a dopant, which are stacked successively on a substrate 700 made of n-type GaAs.

The active layer 702 is composed of a repetition of the structure in which the GaInP layers are sandwiched between the AlGaInP layers.

Each of the laser facet regions 713 has a multilayer structure composed of: the n-type clad layer 701 made of n-type AlGaInP; the guide layer 702a (with a thickness of 30 nm) made of AlGaInP; an alloyed active layer 711 made of alloyed GaInP and AlGaInP; the guide layer 702b (with a thickness of 30 nm) made of AlGaInP; the first p-type clad layer 703 made of p-type AlGaInP containing Zn as a dopant; the current block layer 704 made of n-type AlGaInP; the second p-type clad layer 705 made of p-type AlGaInP containing Zn as a dopant; and the contact layer 706 made of p-type GaAs containing Zn as a dopant, which are stacked successively on the substrate 700 made of n-type GaAs.

An n-side electrode 708 made of a metal (such as an alloy of Au, Ge, or Ni) making an ohmic contact with the n-type GaAs substrate 700 is formed on the lower surface of the n-type GaAs substrate 700. A p-side electrode 709 made of a metal (such as an alloy of Cr, Pt, or Au) making an ohmic contact with the contact layer 706 is formed on the upper surface of the contact layer 706.

The alloyed active layer 711 has been disordered through the solid-phase diffusion of Zn. This increases the band gap of the alloyed active layer 711 and forms a window structure which is transparent to a laser beam emitted from the semiconductor laser device 70.

The formation of the window structure through the diffusion of Zn mentioned above increases the reliability of a semiconductor laser device and provides a semiconductor laser device capable of producing a 50-mW class output.

In either of the cases where the methods disclosed in the foregoing publications are used, thermal treatment should be performed in the steps of causing solid-phase diffusion of Zn from the diffusion source to the active layer and alloying the active layer.

If the thermal treatment is performed in the step of causing solid-phase diffusion of Zn, Zn that has been introduced as a dopant in the first p-type clad layer 703, the second p-type clad layer 705, and the contact layer 706 is diffused not only into the portions of the active layer 702 located in the laser facet regions 713 of the semiconductor laser device 70 but also into the portion of the active layer 702 located in the internal region 712 thereof. If a dopant such as Zn is diffused into the active layer 702, a nonradiative recombination center may be formed within the active layer 702 to degrade the characteristics of the semiconductor laser device 70. Otherwise, a crystal defect may be formed within the active layer 702 to reduce the lifespan of the semiconductor laser 70.

The amount of the dopant diffused into the individual semiconductor lasers composing the semiconductor laser device 70 is larger as the dopant concentrations of the first p-type clad layer 703, the second p-type clad layer 705, and the contact layer 706 are higher. As the concentration of Zn as the dopant is higher, the problems of the degraded characteristics, reduced lifespan, and the like of the semiconductor laser device accordingly become more conspicuous. To suppress the diffusion of Zn into the portion of the active layer 702 located in the internal region 712, therefore, the doping concentrations of Zn in the first p-type clad layer 703, the second p-type clad layer 705, and the contact layer 706 are preferably lowered.

However, the doping concentrations of Zn in the first p-type clad layer 703, the second p-type clad layer 705, and the contact layer 706 greatly affect the temperature characteristic of the semiconductor laser device 70. If the doping concentrations of Zn in the first p-type clad layer 703, the second p-type clad layer 705, and the contact layer 706 are lowered as described above, the band offset of the conduction band is reduced between the first p-type clad layer 703 and the active layer 702. This indicates that a sufficiently large band barrier against electrons in the conduction band cannot be formed between the first p-type clad layer 703 and the active layer 702. As a result, electrons overflowing from the active layer 702 to the first p-type clad layer 703 are increased. Even if an injected current is increased, an increase in current component contributing to light emission is reduced and a light output is saturated. The problem is encountered particularly at a high temperature that a high output cannot be produced.

FIG. 11 shows a measurement profile obtained as a result of secondary ion mass spectroscopy (hereinafter referred to as SIMS) performed with respect to the laser facet regions 713 and internal region 712 of the conventional semiconductor laser device 70 having the first p-type clad layer 703 doped with Zn at a high concentration. It is to be noted that the dopant had not been introduced into the active layer 702.

As shown in FIG. 11, Zn was mixed in the portion of the active layer 702 located in the internal region 712 irrespective of the fact the dopant had not been introduced therein intentionally. This is because Zn introduced at a high concentration into the first p-type clad layer 703 was diffused in the thermal treatment step for forming the window structure. Similar dopant diffusion also occurs during the operation of the semiconductor laser device.

SUMMARY OF THE INVENTION

The present invention has been achieved to solve the foregoing problems and it is therefore an object of the present invention to provide a semiconductor laser device with high reliability.

A first semiconductor laser device according to the present invention comprises: a semiconductor substrate having a first region and a second region adjacent to the first region; a first active layer formed on the first region and made of a compound semiconductor; a first clad layer formed on the first active layer and made of a compound semiconductor containing a first dopant; and a second active region formed on the second region and made of a compound semiconductor containing a second dopant having a diffusion coefficient with respect to the first active region which is higher than that of the first dopant.

The present invention suppresses the diffusion of the first dopant from the first clad layer into the first active layer. This reduces crystal defects in the first active layer and provides the semiconductor laser device according to the present invention with high reliability.

Preferably, a concentration of the first dopant in the first clad layer is in a range of $5 \times 10^{17}$ atoms cm$^{-3}$ to $1 \times 10^{19}$ atoms cm$^{-3}$.

Since the present invention suppresses the diffusion of the first dopant from the first clad layer to the first active layer, a doping concentration in the first clad layer can be set to a high value. Accordingly, the concentration of the first dopant can be set to a high value in the range of $5 \times 10^{17}$ atoms cm$^{-3}$ to $1 \times 10^{19}$ atoms cm$^{-3}$. This suppresses the overflow of electrons and provides a semiconductor laser device capable of performing a high-output operation at a high temperature.

The first active layer may be made of $(Al_xGa_{1-x})_{1-y}In_yP$ ($0 \leq x \leq 1$, $0 \leq y \leq 1$), the first clad layer may be made of $(Al_cGa_{1-c})_{1-d}In_dP$ ($0 \leq c \leq 1$, $0 \leq d \leq 1$), and the first dopant may be at least one element selected from the group consisting of Mg, Be, Cd, and Hg.

The first active layer preferably includes two types of layers made of compound semiconductors with different band gaps and alternately stacked and the second active layer is preferably made of alloyed compound semiconductors with different band gaps.

In the arrangement, the first active layer is larger in band gap than the first active layer and becomes transparent to a laser beam emitted from the semiconductor laser device. Consequently, the laser beam is emitted from the first active layer without being absorbed by the second active layer. This suppresses or prevents COD in the semiconductor laser device.

An uppermost portion of the semiconductor substrate is preferably composed of a second clad layer made of a compound semiconductor of a conductivity type opposite to that of the first clad layer and the second clad layer preferably contains a third dopant having a diffusion coefficient with respect to the first active layer which is lower than that of the second dopant.

The arrangement suppresses or prevents the diffusion of the third dopant from the second clad layer into the first active layer.

A second semiconductor laser device according to the present invention comprises: a semiconductor substrate; an active layer formed on the semiconductor substrate and made of a compound semiconductor; and a first clad layer formed on the active layer and made of a compound semiconductor containing a first dopant having a diffusion coefficient with respect to the active region which is lower than that of Zn.

The present invention suppresses the diffusion of the first dopant from the first clad layer into the active layer. This reduces crystal defects in the active layer and provides the semiconductor laser device according to the present invention with high reliability.

Preferably, a concentration of the first dopant in the first clad layer is in a range of $5 \times 10^{17}$ atoms cm$^{-3}$ to $1 \times 10^{19}$ atoms cm$^{-3}$.

Since the present invention suppresses the diffusion of the dopant from the first clad layer into the active layer, a doping concentration in the first clad layer can be set to a high value. Accordingly, the concentration of the dopant can be set to a high value in the range of $5 \times 10^{17}$ atoms cm$^{-3}$ to $1 \times 10^{19}$ atoms cm$^{-3}$. This suppresses the overflow of electrons and provides a semiconductor laser device capable of performing a high-output operation at a high temperature.

The active layer may be made of $(Al_xGa_{1-x})_{1-y}In_yP$ ($0 \leq x \leq 1$, $0 \leq y \leq 1$), the first clad layer may be made of $(Al_cGa_{1-c})_{1-d}In_dP$ ($0 \leq c \leq 1$, $0 \leq d \leq 1$), and the first dopant may be at least one element selected from the group consisting of Mg, Be, Cd, and Hg.

The active layer preferably has a first region including two types of layers made of compound semiconductors with different band gaps and alternately stacked and a second region adjacent to the first region and made of alloyed compound semiconductors with different band gaps and the second region of the active layer preferably contains a second dopant having a diffusion coefficient with respect to the active layer which is higher than that of the first dopant.

In the arrangement, the second region of the active layer is larger in band gap than the first region of the active layer and becomes transparent to a laser beam emitted from the first region of the active layer. Consequently, the laser beam is emitted from the first region of the active layer without being absorbed by the second region of the active layer. This suppresses or prevents COD in the semiconductor laser device.

An uppermost portion of the semiconductor substrate is preferably composed of a second clad layer made of a compound semiconductor of a conductivity type opposite to that of the first clad layer and the second clad layer preferably contains a third dopant having a diffusion coefficient with respect to the active layer which is lower than that of the first dopant.

The arrangement suppresses or prevents the diffusion of the third dopant from the second clad layer into the first active layer.

A first method for fabricating a semiconductor laser device according to the present invention comprises the steps of: (a) preparing a semiconductor substrate having a first region and a second region adjacent to the first region; (b) depositing an active layer made of a compound semiconductor over the first and second regions; (c) depositing, on the substrate, a first clad layer made of a compound semiconductor containing a first dopant; and (d) diffusing, into a portion of the active layer located in the second region, a second dopant having a diffusion coefficient with respective to the active layer which is higher than that of the first dopant to alloy the portion of the active layer located in the second region.

The present invention suppresses the diffusion of the first dopant from the first clad layer into the portion of the active layer located in the first region. This reduces crystal defects in the portion of the active layer located in the first region. The portion of the active layer located in the second region is larger in band gap than the portion of the active layer located in the first region and becomes transparent to a laser beam emitted from the portion of the active layer located in the first region. Consequently, the laser beam is emitted from the portion of the active layer located in the first region without being absorbed by the portion of the active layer located in the second region. This suppresses or prevents COD in the semiconductor laser device and provides the semiconductor laser device with high reliability.

The first method may further comprise the steps of: (e) after the step (c), depositing a current block layer made of a compound semiconductor on the substrate; (f) forming an opening configured as a stripe in the current block layer; and (g) depositing a second clad layer made of a compound semiconductor on the substrate.

The first method may further comprise the steps of: (h) after the step (c), successively depositing, on the substrate, an etching stop layer and a second clad layer made of a compound semiconductor; (i) after the step (d), forming a mask having an opening on the second clad layer; (j) removing a portion of the second clad layer located in the opening by using the mask to expose the etching stop layer in the opening; and (k) forming a current block layer made of a compound semiconductor on the substrate.

A second method for fabricating a semiconductor laser device according to the present invention comprises the steps of: (a) depositing an active layer made of a compound semiconductor on a semiconductor substrate; and (b) depositing, on the substrate, a clad layer made of a compound semiconductor containing a dopant having a diffusion coefficient with respect to the active layer which is lower than that of Zn.

The present invention suppresses the diffusion of the dopant from the clad layer into the active layer. This reduces crystal defects in the active layer and provides the semiconductor laser device according to the present invention with high reliability.

BRIEF DESCRIPTION OF THE DRAWINGS

FIG. 5 shows a SIMS profile obtained from the semiconductor laser device according to EMBODIMENT 1;

DETAILED DESCRIPTION OF THE INVENTION

Figure 1:
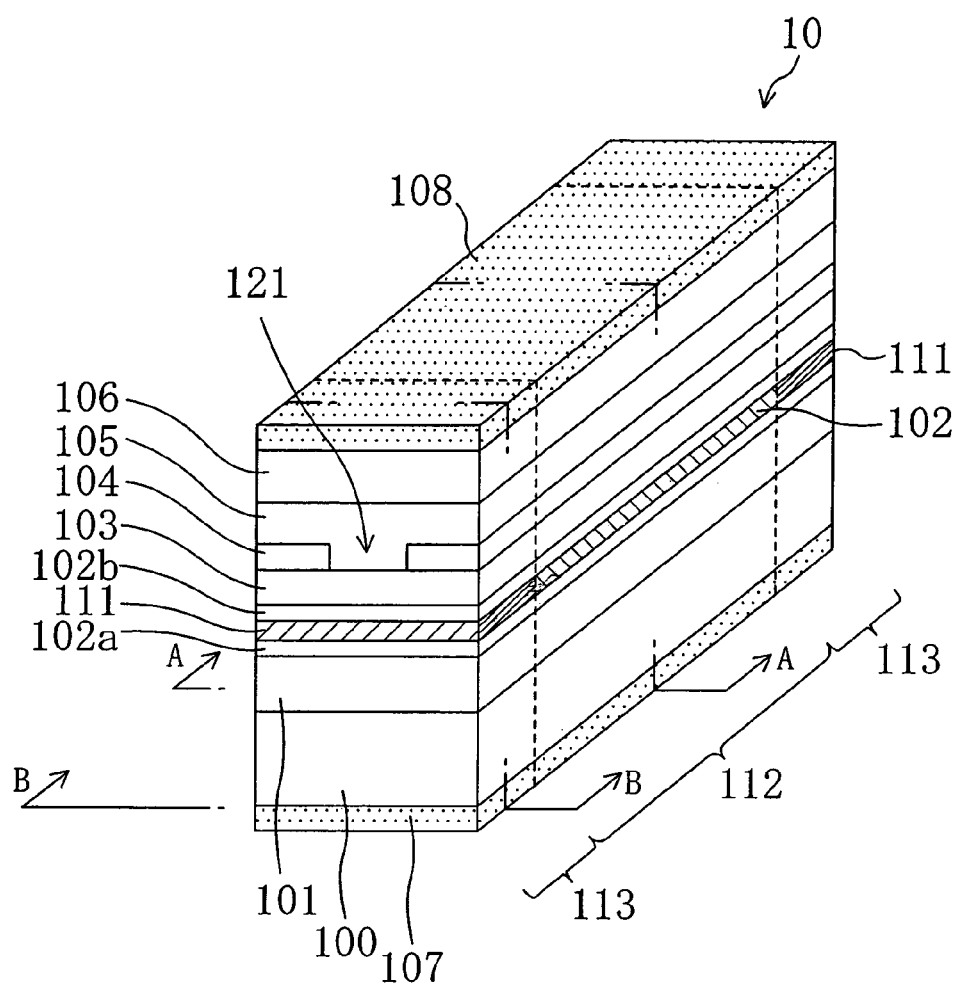
FIG. 1 is a perspective view showing a structure of a semiconductor laser device according to EMBODIMENT 1.

Referring to the drawings, the embodiments of the present invention will be described herein below. For the sake of simplicity, components common to the individual embodiments are designated by the same reference numerals.

Emdodiment 1

FIG. 1 is a perspective view showing a structure of a semiconductor laser device according to EMBODIMENT 1.

Figure 2A:
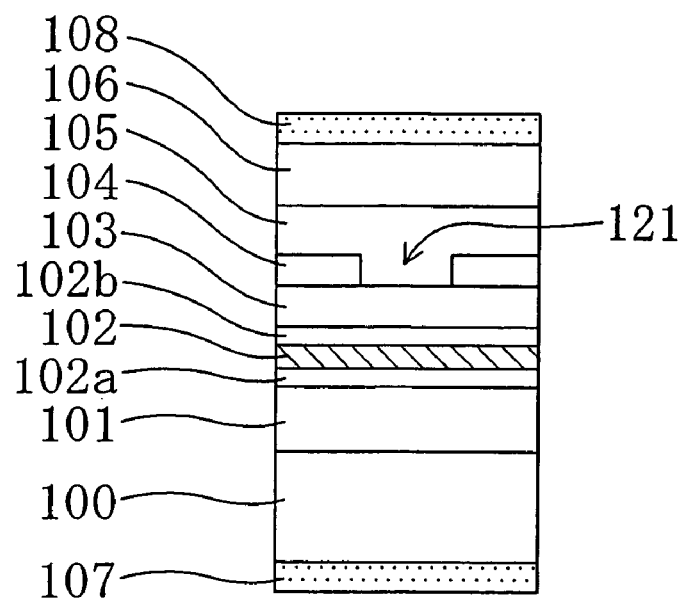
FIG. 2A is a cross-sectional view taken along the line A—A shown in FIG. 1
Figure 2B:
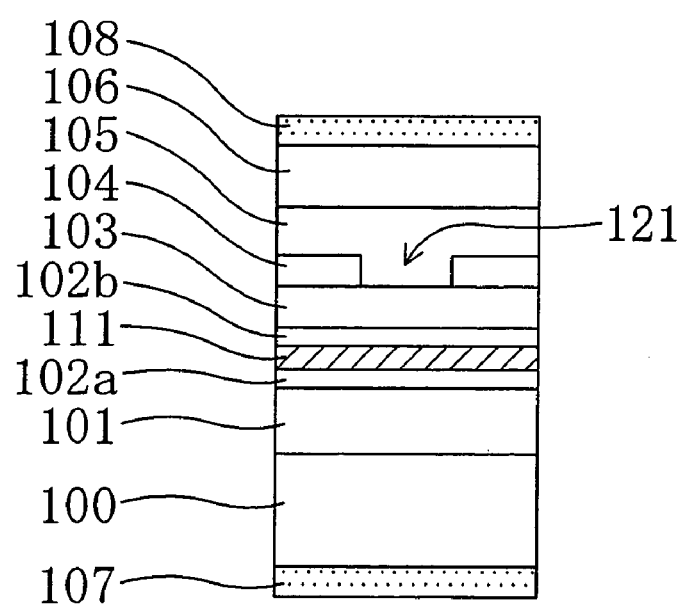
FIG. 2B is a cross-sectional view taken along the line B—B shown in FIG. 1.

FIG. 2A is a cross-sectional view taken along the line A—A shown in FIG. 1. FIG. 2B is a cross-sectional view taken along the line B—B shown in FIG. 1.

As shown in FIG. 1, a semiconductor laser device 10 according to the present embodiment has a structure (so-called window structure) comprising an internal region 112 and laser facet regions 113.

As shown in FIGS. 1 and 2A, the internal region 112 has a multilayer structure composed of an n-type clad layer 101 made of n-type AlGaInP; a guide layer 102a (with a thickness of 30 nm) made of AlGaInP; an active layer 102 composed of a quantum well consisting of a plurality of GaInP layers and a plurality of AlGaInP layers; a guide layer 102b (with a thickness of 30 nm) made of AlGaInP; a first p-type clad layer 103 made of p-type AlGaInP containing Mg as a dopant; a current block layer 104 made of n-type AlGaInP; a second p-type clad layer 105 made of p-type AlGaInP containing Mg as a dopant; and a contact layer 106 made of p-type GaAs containing Mg as a dopant, which are stacked successively on a substrate 100 made of n-type GaAs.

In the present embodiment, the active layer 102 is composed of a repetition of the structure in which the GaInP layers are sandwiched between the AlGaInP layers.

As shown in FIGS. 1 and 2B, each of the laser facet regions 113 has a multilayer structure composed of: the n-type clad layer 101 made of n-type AlGaInP; the guide layer 102a (with a thickness of 30 nm) made of AlGaInP; alloyed active layers 111 each containing Zn diffused therein and made of alloyed GaInP and AlGaInP; the guide layer 102b (with a thickness of 30 nm) made of AlGaInP; the first p-type clad layer 103 made of p-type AlGaInP containing Mg as a dopant; the current block layer 104 made of n-type AlGaInP; the second p-type clad layer 105 made of p-type AlGaInP containing Mg as a dopant; and the contact layer 106 made of p-type GaAs containing Mg as a dopant, which are stacked successively on the substrate 100 made of n-type GaAs.

In particular, a superlattice in each of the alloyed active layers 111 according to the present embodiment has been alloyed through the diffusion of Zn. The band gap of each of the alloyed active layers 111 is larger than that of the active layer 102 in the internal region 112.

An n-side electrode 107 made of a metal (such as an alloy of Au, Ge, or Ni) making an ohmic contact with the n-type GaAs substrate 100 is formed on the lower surface of the n-type GaAs substrate 100. A p-side electrode 108 made of a metal (such as an alloy of Cr, Pt, or Au) making an ohmic contact with the contact layer 106 is formed on the upper surface of the contact layer 106.

As shown in FIGS. 1, 2A, and 2B, the current block layer 104 is formed with an opening 121 configured as a rectangle (stripe) reaching the first p-type clad layer 103.

Through the opening 121, the first and second p-type clad layers 103 and 105 are in contact with each other. A current is injected through the opening 121 into the active layer 102 to cause laser oscillation.

In the present embodiment, AlGaInP represent $(Al_xGa_{1-x})_{1-y}In_yP$ ($0 \leq x \leq 1$, $0 \leq y \leq 1$). In particular, GaInP represents a material obtained when x=0 is satisfied in $(Al_xGa_{1-x})_{1-y}In_yP$.

Table 1 shows the specific compositions, thicknesses, dopant concentrations (impurity concentrations) of the individual layers of the semiconductor laser device 10 according to the present embodiment.

TABLE 1

| Layer | Thickness | Impurity Concentration (atoms cm$^{-3}$) | Al Composition Ratio x |
|---|---|---|---|
| n-Type Clad Layer 101 | 1.5 µm | $1 \times 10^{18}$ | 0.7 |
| Guide Layer 102a | 30 nm | Undoped | 0.5 |
| Active Layer 102 | | | |
| GaInP Layers (3 in Total) | 6 nm | Undoped | 0 |
| AlGaInP Layers (2 in Total) | 6 nm | Undoped | 0.5 |
| Guide Layer 102b | 30 nm | Undoped | 0.5 |
| First p-Type Clad Layer 103 | 0.2 µm | $1 \times 10^{18}$ | 0.7 |
| Current Block Layer 104 | 0.3 µm | $1 \times 10^{18}$ | 1.0 |
| Second p-Type Clad Layer 105 | 1.5 µm | $1 \times 10^{18}$ | 0.7 |
| Contact Layer 106 | 2.0 µm | $1 \times 10^{18}$ | GaAs |

In the present embodiment, y representing the composition ratio of In has a value of about 0.5 in each of the n-type clad layer 101, the guide layer 102a, the active layer 102, the guide layer 102b, the first p-type clad layer 103, the current block layer 104, and the second p-type clad layer 105 each composed of a material represented by $(Al_xGa_{1-x})_{1-y}In_yP$. To achieve lattice matching with the n-type GaAs substrate 100, the value of y representing the In composition ratio is preferably in the range of $0.45 \leq y \leq 0.55$. It will easily be appreciated that, if another substrate is used, the value of y may be varied appropriately depending on the substrate and the value of y is not limited to the foregoing range.

A description will be given to a method for fabricating the semiconductor laser device 10 according to the present embodiment with reference to FIGS. 3 and 4. FIGS. 3 and 4 are perspective views diagrammatically showing the individual process steps of the method for fabricating the semiconductor laser device according to the present embodiment.

Figure 3A:
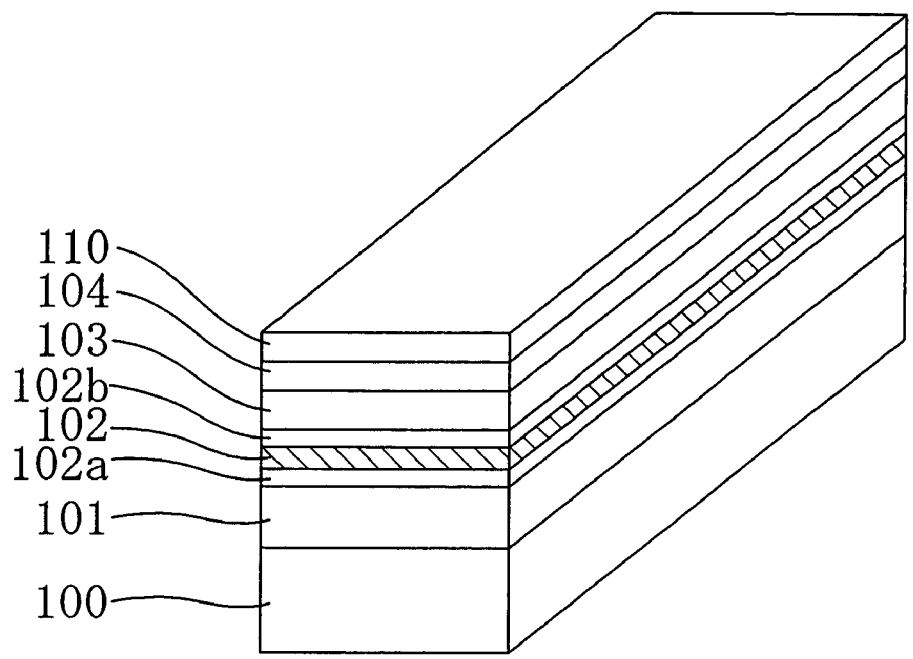
FIGS. 3A and 3B are perspective views is a perspective view diagrammatically showing the individual process steps of a method for fabricating the semiconductor laser device according to EMBODIMENT 1.

First, in the step shown in FIG. 3A, the substrate 100 made of n-type GaAs is prepared. Then, the n-type clad layer 101 made of n-type AlGaInP, the guide layer 102a made of AlGaInP, the active layer 102, the guide layer 102b made of AlGaInP, the first p-type clad layer 103 made of p-type AlGaInP, the current block layer 104 made of n-type AlGaInP, and a cap layer 110 made of GaAs are deposited successively by, e.g., metal organic chemical vapor deposition (hereinafter referred to as MOCVD) or molecular beam epitaxy (hereinafter referred to as MBE). The active layer 102 is formed by alternately depositing the GaInP layers and the AlGaInP layers.

In forming the first p-type clad layer 103 made of p-type AlGaInP in the foregoing step, Mg is introduced as a p-type dopant. The introduction of Mg is effected by using a method well known to those skilled in the art, such as one which mixes $Mg(C_5H_5)_2$ in a raw material gas and forms an AlGaInP layer by crystal growth, one which forms an undoped AlGaInP layer and introduces Mg by ion implantation, or one which forms an undoped AlGaInP layer by crystal growth and uses MgO as a diffusion source to introduce Mg by solid-phase diffusion.

Figure 3B:
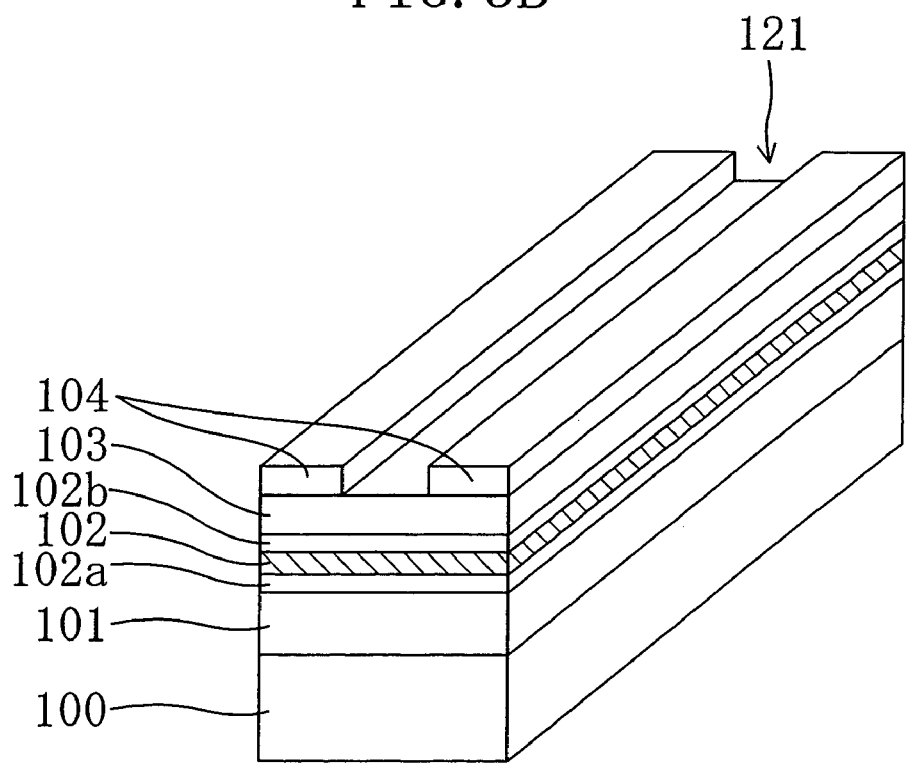

Next, in the step shown in FIG. 3B, the cap layer 110 is etched away, a resist film is patterned into a rectangle (stripe) by photolithography, and the current block layer 104 is etched by using the resist film as a mask so that the openings 121 configured as the rectangle (stripe) is formed in the current block layer 104.

Figure 4A:
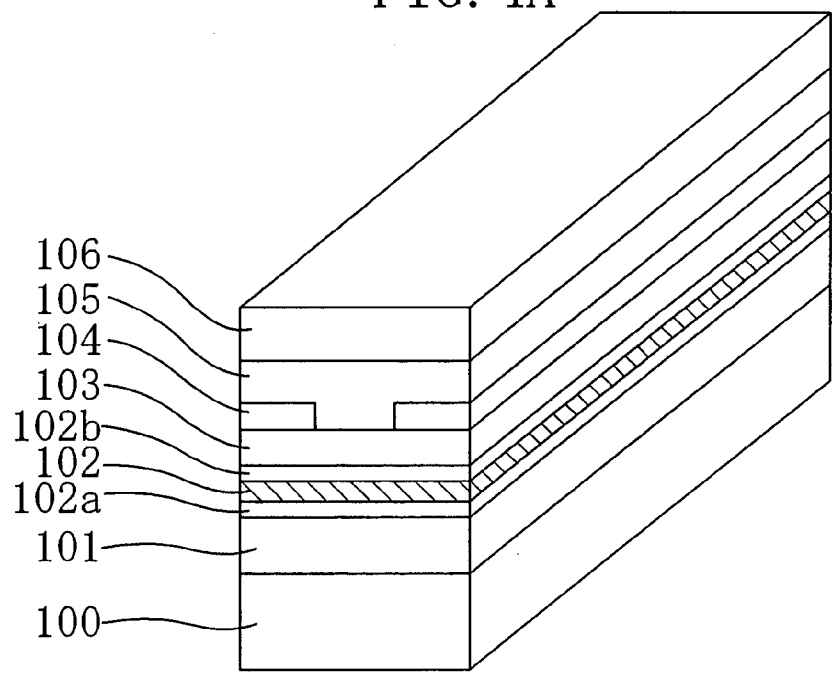
FIGS. 4A and 4B are perspective views diagrammatically showing the individual process steps of the method for fabricating the semiconductor laser device according to EMBODIMENT 1.

Subsequently, in the step shown in FIG. 4A, the second p-type clad layer 105 made of p-type AlGaInP and the contact layer 106 made of p-type GaAs are deposited successively by, e.g., MOCVD or MBE on the substrate obtained in the previous step. In forming the second p-type clad layer 105 and the contact layer 106 also, Mg is introduced as a p-type dopant. The introduction of Mg is effected by the same method as used in forming the first p-type clad layer 103 in the step shown in FIG. 3A, which is well known to those skilled in the art.

Figure 4B:
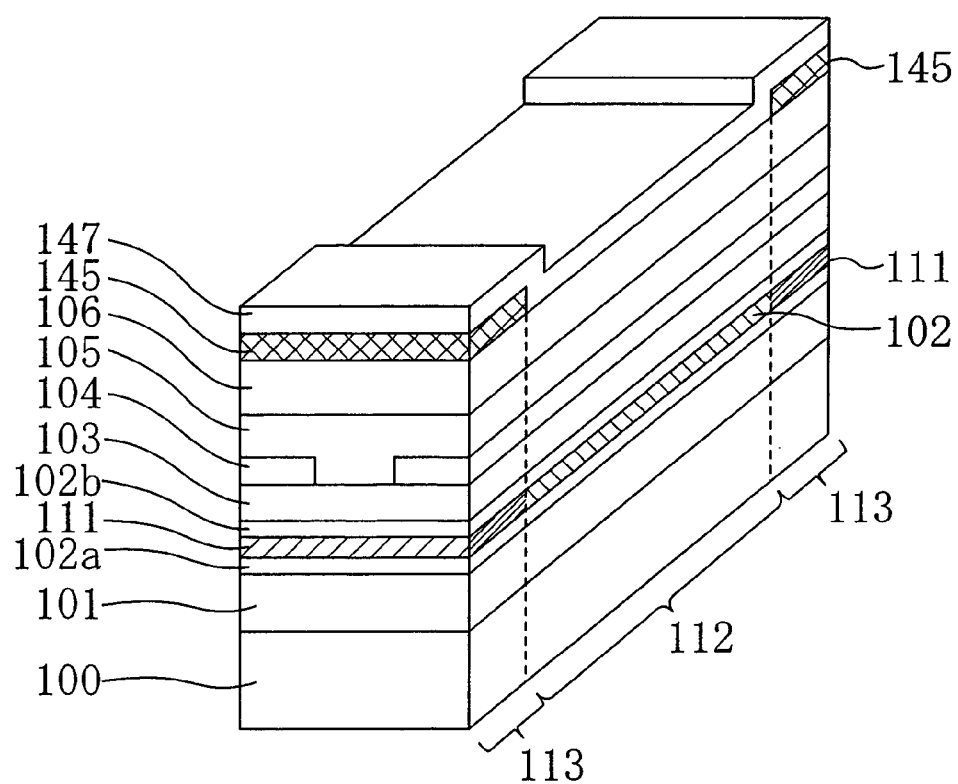

Next, in the step shown in FIG. 4B, a ZnO film is deposited by sputtering or the like on the substrate obtained in the previous step. Subsequently, photolithography and wet etching is performed to remove the portion of the ZnO film located in the internal region 112, thereby forming a ZnO diffusion source 145. Then, a $SiO_2$ film 147 is deposited by, e.g., CVD on the substrate. Subsequently, the substrate is thermally treated such that Zn is diffused from the ZnO diffusion source 145 to the active layer 102 and that inter-substitution occurs between the elements of GaInP and AlGaInP composing the active layer 102 (alloying process). As a result, the alloyed active layers 111 each having a band gap larger than that of the active layer 102 are formed.

In particular, the diffusion coefficient of Zn in a group III–V compound semiconductor is relatively large. This allows effective doping of the active layer 102 with Zn. In addition, Zn exerts a large effect of alloying a superlattice structure composed of the AlGaInP material when it is diffused. Consequently, the portion of the active layer 102 located in the laser facet region 113 is alloyed efficiently.

The $SiO_2$ film 147 has the function of protecting the contact layer 106 during the diffusion of Zn.

Subsequently, the ZnO diffusion source 145 and the $SiO_2$ film 147 are etched away. Finally, the p-side electrode 108 is formed by electron beam vapor deposition or the like on the contact layer 106. Likewise, the n-side electrode 107 is also formed by electron beam vapor deposition or the like on the substrate 100, whereby the semiconductor laser device 10 according to the present embodiment shown in FIG. 1 is obtained.

The semiconductor laser device 10 according to the present embodiment has used Mg as a p-type dopant for the first p-type clad layer 103, the second p-type clad layer 105, and the contact layer 106. In general, the diffusion coefficient of Mg in a semiconductor material is lower than that of Zn used conventionally as a p-type dopant. In diffusing Zn by thermal treatment in the step shown in FIG. 4B, therefore, the diffusion of Mg as a dopant from the first p-type clad layer 103 to the portion of the active layer 102 located in the internal region 112 is suppressed satisfactorily.

It will easily be appreciated that, during the deposition of each of the first p-type clad layer 103, the second p-type clad layer 105, and the contact layer 106, the diffusion of the dopant from the first p-type clad layer 103 to the active layer 102 is similarly suppressed or prevented. Similar diffusion of the dopant is also suppressed or prevented during the operation of the semiconductor laser device. This reduces crystal defects in the portion of the active layer 102 located in the internal region 112 and provides the semiconductor laser device 10 according to the present embodiment with high reliability.

In the fabrication of the semiconductor laser device 10 according to the present embodiment, the diffusion of Mg as a dopant is suppressed when Zn is diffused by thermal treatment in the step shown in FIG. 4B. Accordingly, the doping concentration of the first p-type clad layer 103 can be set to a high value. Preferably, the doping concentration of the first p-type clad layer 103 is in the range of $5 \times 10^{17}$ atoms $cm^{-3}$ to $1 \times 10^{19}$ atoms $cm^{-3}$. The high doping concentration of the first p-type clad layer 103 suppresses the overflow of electrons and provides a red semiconductor laser device capable of performing a high-output operation at a high temperature.

A detailed description will be given herein below to the effect of suppressing the diffusion of the dopant into the active layer 102 achieved in the semiconductor laser device 10 according to the present embodiment.

FIG. 5 shows a SIMS profile obtained from the n-type clad layer 101, guide layer 102a, active layer 102, guide layer 102b, and first p-type clad layer 103 of the semiconductor laser device 10 according to the present embodiment.

As shown in FIG. 5, Zn at a concentration of about $2 \times 10^{18}$ atoms $cm^{-3}$ has been implanted into the alloyed active layer 111 in each of the laser facet regions 113 of the semiconductor laser device 10 according to the present embodiment. The foregoing concentration is sufficient to alloy the active layer and form the window structure. It has been proved that the alloyed active layer 111 in the laser facet region 113 is formed when Zn at a concentration of $7 \times 10^{17}$ atoms $cm^{-3}$ or more is diffused.

On the other hand, the diffusion of Mg to the portion of the active layer 102 located in the internal region 112 has not occurred, as shown in FIG. 5, irrespective of the first p-type clad layer 103 doped with Mg at a high concentration of $2 \times 10^{18}$ atoms $cm^{-3}$. This is because Mg having a diffusion coefficient lower than that of Zn is used as the dopant.

In the present embodiment, silicon has been used as an n-type dopant in the n-type clad layer 101. As another n-type dopant, selenium can also be used. In general, dopants such as silicon and selenium have diffusion coefficients in a semiconductor material which are lower than the diffusion coefficient of Zn used as a p-type dopant. As a result, the diffusion of an n-type dopant from the n-type clad layer 101 to the active layer 102 can also be suppressed or prevented.

A description will be given next to the operation of the semiconductor laser device 10 according to the present embodiment.

If a voltage is applied between the n-side electrode 107 and the p-side electrode 108 such that a current is injected to flow therebetween, the injected current is confined by the current block layer 104 in the second p-type clad layer 105 so that a laser beam at an oscillating wavelength of 650 nm is emitted from the active layer 102.

The semiconductor laser device 10 according to the present embodiment has a structure (i.e., window structure) in which the alloyed active layer 111 is formed in each of the laser facet regions 113. The alloyed active layer 111 has a band gap larger than that of the portion of the active layer 102 located in the internal region 112 so that the absorption of the emitted beam is suppressed in each of the laser facet regions 113. This increases the level at which damage to the laser facet occurs and allows a high-output operation.

In addition, the semiconductor laser device 10 according to the present embodiment has used Mg having a diffusion coefficient lower than that of Zn as a dopant for the first p-type clad layer 103. As a result, the diffusion of Mg to the portion of the active layer 102 located in the internal region 112 is suppressed or prevented. This suppresses the formation of crystal defects in the active layer 102 and significantly increases the reliability of the semiconductor laser device 10.

Moreover, the first p-type clad layer 103 heavily doped with Mg as a p-type dopant effectively suppresses the overflow of electrons from the active layer to the p-type clad layer.

When the semiconductor laser device 10 according to the present embodiment was operated actually, an output of 100 mW was obtained without the occurrence of thermal saturation even at an ambient temperature of 70° C.

Although the present embodiment has used a substrate made of n-type GaAs as the substrate 100, it is not limited thereto. A p-type substrate (such as a p-type GaAs substrate) may also be used instead.

Although the present embodiment has used an active layer having a multiple quantum well structure as the active layer 102, it is not limited thereto. For example, a single quantum well structure or a bulk quantum well structure may also be used instead.

Although the present embodiment has used the current block layer 104 made of AlGaInP and having an effective index-guided structure, it is not limited thereto. For example, a current block layer made of GaAs and having a complex index-guided structure may also be used instead.

Although the present embodiment has been described by using Zn as the dopant implanted into the laser facet regions 113 and using Mg as the p-type dopant, it is not limited thereto. It is also possible to use another material having a high diffusion coefficient as the dopant implanted into the laser facet regions 113 and use another material having a low diffusion coefficient as the p-type dopant. For example, Mg may be used appropriately as the dopant implanted into the laser facet regions 113 and any of Be, Cd, and Hg may be used appropriately as the p-type dopant.

Although the present embodiment has described the method in which the active layer is alloyed by implanting Zn by solid-phase diffusion, it is not limited thereto. The alloyed active layer can similarly be formed even if a method is adopted in which the active layer is alloyed by ion-implanting Zn into the vicinity of the active layer and a thermal treatment is performed subsequently.

Although the present embodiment has described the semiconductor laser device having the window structure, the semiconductor laser device may also be constructed without the laser facet regions 113 (i.e., without the window structure).

Even if the semiconductor laser device is constructed without the laser facet regions 113, the use of a material having a diffusion coefficient lower than that of Zn, such as Mg, as the p-type dopant also suppresses or prevents the diffusion of the dopant from the first p-type clad layer 103 to the active layer 102 during the deposition of each of the first p-type clad layer 103, the second p-type clad layer 105, and the contact layer 106 in the same manner as in the semiconductor laser device 10 according to the present embodiment.

Since the diffusion of the dopant from the first p-type clad layer 103 to the active layer 102 is suppressed or prevented in the semiconductor laser device constructed without the laser facet regions 113, the doping concentration of the first p-type clad layer 103 can be set to a high value in the same manner as in the semiconductor laser device 10 according to the present embodiment. This suppresses the overflow of electrons and provides a red semiconductor laser device capable of performing a high-output operation at a high temperature.

Embodiment 2

Figure 6:
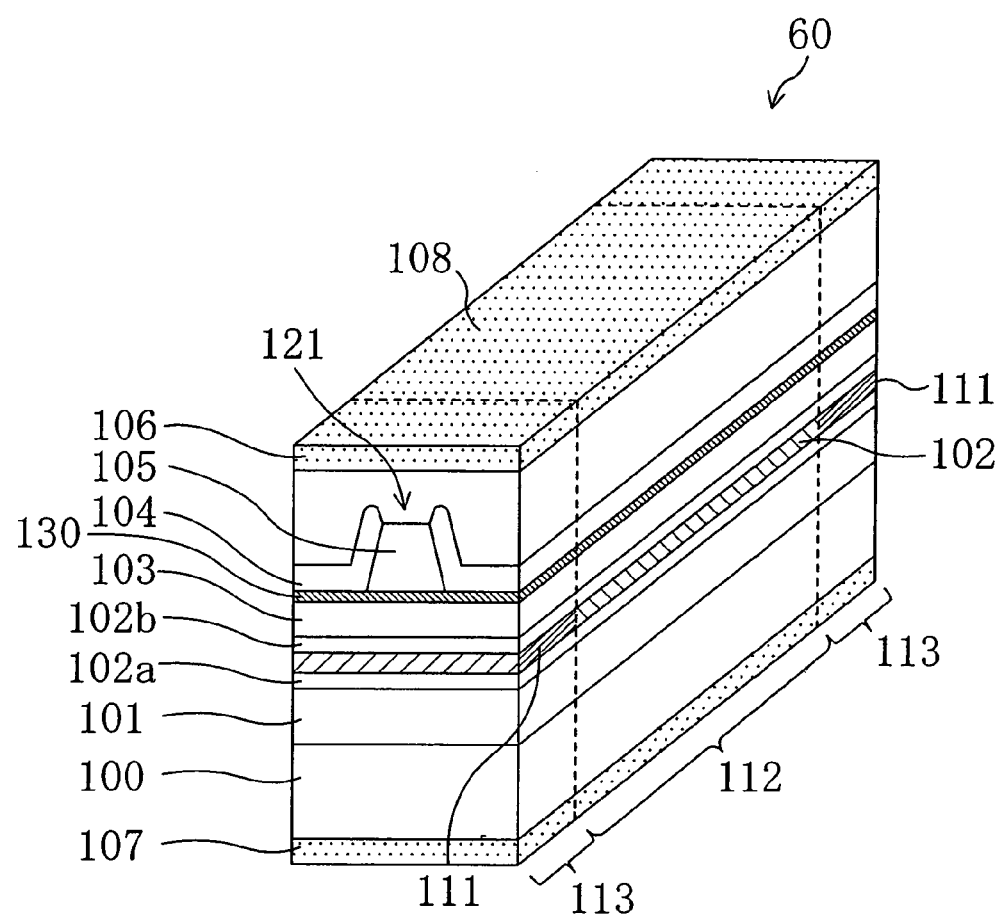
FIG. 6 is a perspective view showing a structure of a semiconductor laser device according to EMBODIMENT 2.

Although EMBODIMENT 1 has described the semiconductor laser device having an inner-stripe waveguide structure, the present invention is not limited thereto. The semiconductor laser device according to the present invention may also has, e.g., a ridge waveguide structure. Referring to FIG. 6, the present embodiment will describe a semiconductor laser device 60 having a ridge waveguide structure.

As shown in FIG. 6, the semiconductor laser device 60 according to the present embodiment has a structure (so-called window structure) comprising an internal region 112 and laser facet region 113.

As shown in FIG. 6, the internal region 112 has a multilayer structure composed of an n-type clad layer 101 made of n-type AlGaInP; a guide layer 102a (with a thickness of 30 nm) made of AlGaInP; an active layer 102 composed of a quantum well consisting of a plurality of GaInP layers and a plurality of AlGaInP layers; a guide layer 102b (with a thickness of 30 nm) made of AlGaInP; a first p-type clad layer 103 made of p-type AlGaInP containing Mg as a dopant; an etching stop layer 130 made of GaInP; a current block layer 104 made of n-type AlGaInP; a second p-type clad layer 105 made of p-type AlGaInP containing Mg as a dopant; and a contact layer 106 made of p-type GaAs containing Mg as a dopant, which are stacked successively on a substrate 100 made of n-type GaAs.

In the present embodiment, the active layer 102 is composed of a repetition of the structure in which the GaInP layers are sandwiched between the AlGaInP layers.

As shown in FIG. 6, each of the laser facet regions 113 has a multilayer structure composed of: the n-type clad layer 101 made of n-type AlGaInP; the guide layer 102a (with a thickness of 30 nm) made of AlGaInP; alloyed active layers 111 each containing Zn diffused therein and made of alloyed GaInP and AlGaInP; the guide layer 102b (with a thickness of 30 nm) made of AlGaInP; the first p-type clad layer 103 composed of p-type AlGaInP containing Mg as a dopant; the etching stop layer 130 made of GaInP; the current block layer 104 made of n-type AlGaInP; the second p-type clad layer 105 made of p-type AlGaInP containing Mg as a dopant; and the contact layer 106 made of p-type GaAs containing Mg as a dopant, which are stacked successively on the substrate 100 composed of n-type GaAs.

In particular, a superlattice in each of the alloyed active layers 111 according to the present embodiment has been alloyed through the diffusion of Zn. The band gap of each of the alloyed active layers 111 is larger than that of the active layer 102 in the internal region 112.

An n-side electrode 107 made of a metal (such as an alloy of Au, Ge, or Ni) making an ohmic contact with the n-type GaAs substrate 100 is formed on the lower surface of the n-type GaAs substrate 100. A p-side electrode 108 made of a metal (such as an alloy of Cr, Pt, or Au) making an ohmic contact with the contact layer 106 is formed on the upper surface of the contact layer 106.

As shown in FIG. 6, the current block layer 104 is formed with an opening 121 configured as a rectangle (stripe) reaching the etching stop layer 130. Through the opening 121, the etching stop layer 130 and the second p-type clad layer 105 are in contact with each other. A current is injected through the opening 121 into the active layer 102 to cause laser oscillation.

As will be understood from the foregoing description, the individual layers of the semiconductor laser device 60 according to the present embodiment other than the etching stop layer 130 are composed of exactly the same materials as composing those of the semiconductor laser device 10 according to EMBODIMENT 1, which are shown above in Table 1.

A description will be given to a method for fabricating the semiconductor laser device according to the present embodiment with reference to FIGS. 7 and 8. FIGS. 7 and 8 are perspective views diagrammatically showing the individual process steps of the method for fabricating the semiconductor laser device according to the present embodiment.

Figure 7A:
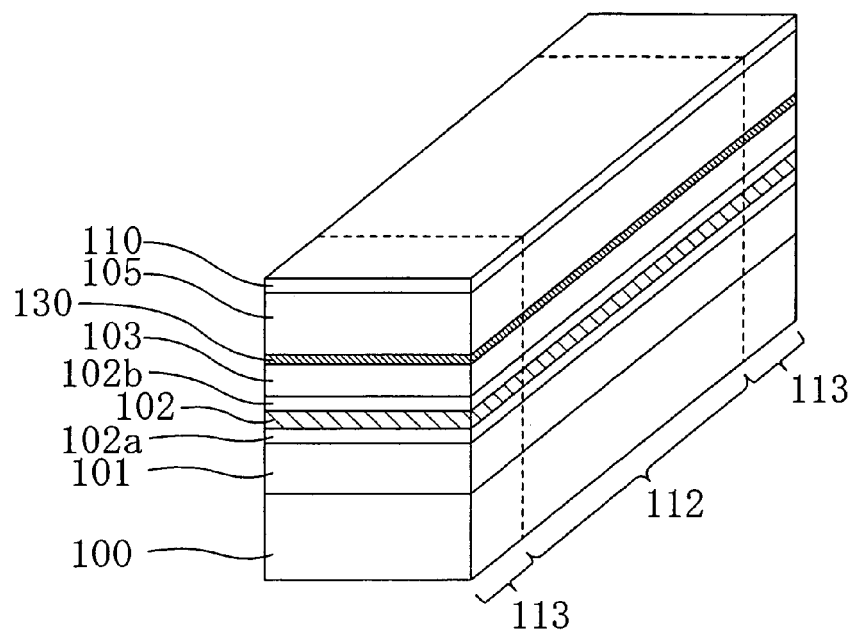
FIGS. 7A and 7B are perspective views diagrammatically showing the individual process steps of a method for fabricating the semiconductor laser device according to EMBODIMENT 2.

First, in the step shown in FIG. 7A, the substrate 100 made of n-type GaAs is prepared. Then, the n-type clad layer 101 made of n-type AlGaInP, the guide layer 102a made of AlGaInP, the active layer 102, the guide layer 102b made of AlGaInP, the first p-type clad layer 103 made of p-type AlGaInP, the etching stop layer 130 made of GaInP, the second p-type clad layer 105 made of p-type AlGaInP, and the cap layer 110 made of GaAs are deposited successively by, e.g., MOCVD or MBE. The active layer 102 is formed by alternately depositing the GaInP layers and the AlGaInP layers.

In forming the first p-type clad layer 103 and the second p-type clad layer 105 in the foregoing step, Mg is introduced as a p-type dopant. The introduction of Mg is effected by using a method well known to those skilled in the art, such as one which mixes $Mg(C_5H_5)_2$ in a raw material gas and forms an AlGaInP layer by crystal growth, one which forms an undoped AlGaInP layer and introduces Mg by ion implantation, or one which forms an undoped AlGaInP layer by crystal growth and uses MgO as a diffusion source to introduce Mg by solid-phase diffusion.

Figure 7B:
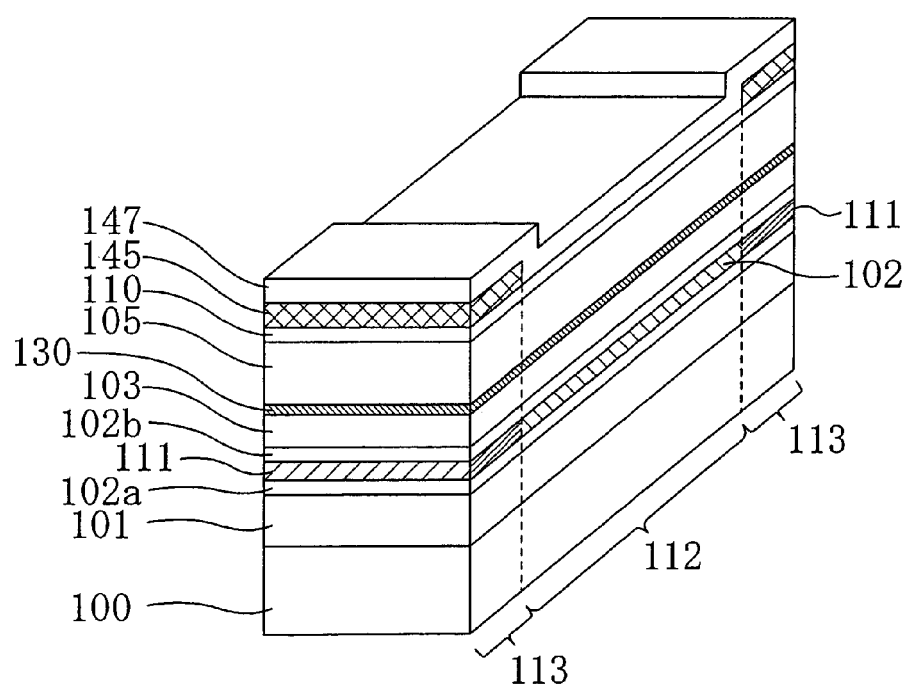

Next, in the step shown in FIG. 7B, a ZnO film is deposited by sputtering or the like on the substrate obtained in the previous step. Subsequently, photolithography and wet etching is performed to remove the portion of the ZnO film located in the internal region 112, thereby forming a ZnO diffusion source 145. Then, a $SiO_2$ film 147 is deposited by, e.g., CVD on the substrate.

Figure 8A:
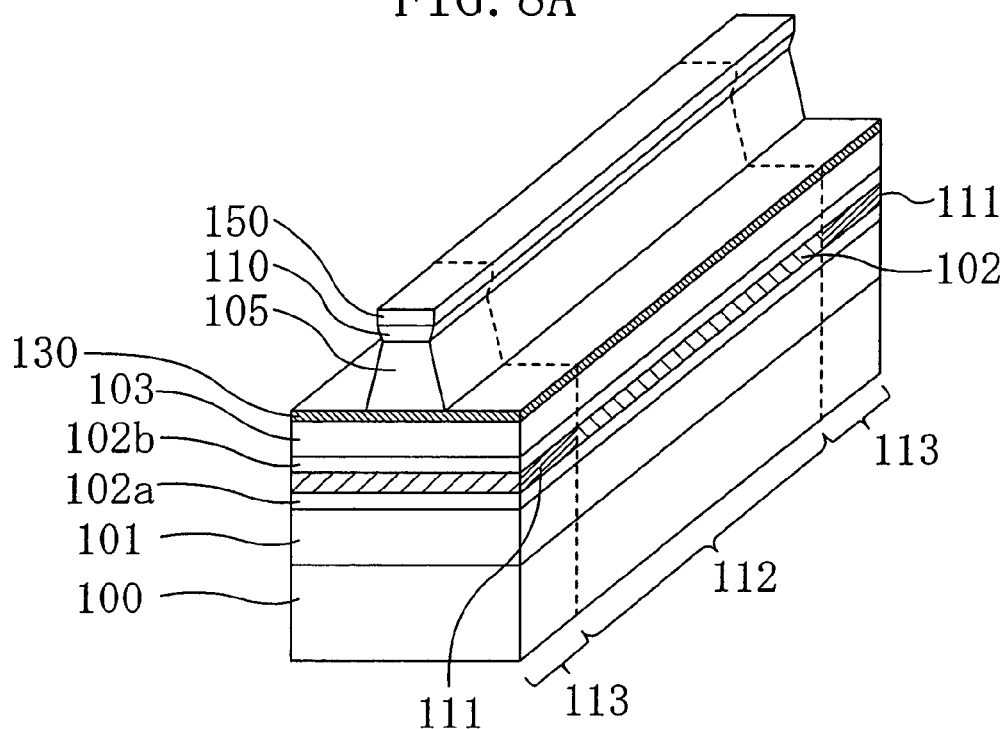
FIGS. 8A and 8B are perspective views diagrammatically showing the individual process steps of the method for fabricating the semiconductor laser device according to EMBODIMENT 2.

Next, in the step shown in FIG. 8A, the substrate obtained in the previous step is thermally treated such that Zn is diffused from the ZnO diffusion source 145 to the active layer 102 and that intersubstitution occurs between the elements of GaInP and AlGaInP composing the active layer 102 (alloying process). As a result, the alloyed active layers 111 are formed. Subsequently, the ZnO diffusion source 145 and the $SiO_2$ film 147 are etched away.

Then, an $SiO_2$ film is formed on the substrate obtained in the previous step. The $SiO_2$ film is further patterned by photolithography and wet etching to form an $SiO_2$ mask 150 configured as a rectangle (stripe) extending crosswise the internal region 112 and the laser facet regions 113. Subsequently, etching is performed by using the $SiO_2$ mask 150, thereby removing the second p-type clad layer 105 and the cap layer 110.

Next, in the step shown in FIG. 5B, the current block layer 104 made of n-type AlGaInP is deposited by, e.g., MOCVD or MBE on the substrate obtained in the previous step. During the deposition, the current block layer 105 is barely deposited on the $SiO_2$ mask 150 composed of an oxide film. Subsequently, the $SiO_2$ mask 150 and the cap layer 110 are etched away.

Next, the contact layer 106 made of p-type GaAs is deposited by, e.g., MOCVD or MBE on the substrate obtained in the previous step. In forming the contact layer 106 made of p-type GaAs, Mg is introduced as a p-type dopant. The introduction of Mg is effected by the same method as used in forming the first p-type clad layer 103 and the second p-type clad layer 105 in the step shown in FIG. 7A, which is well known to those skilled in the art.

Subsequently, the p-side electrode 108 is formed by electron beam vapor deposition or the like on the contact layer 106. Likewise, the n-side electrode 107 is formed by electron beam vapor deposition or the like on the substrate 100, whereby the semiconductor laser device 60 according to the present embodiment shown in FIG. 6 is obtained.

Since the operation of the semiconductor laser device 60 according to the present embodiment is exactly the same as that of the semiconductor laser device 10 according to EMBODIMENT 1, the description thereof will be omitted.

The semiconductor laser device 60 according to the present embodiment has also used Mg as a p-type dopant for the first p-type clad layer 103, the second p-type clad layer 105, and the contact layer 106, similarly to the semiconductor laser device 10 described above. In general, the diffusion coefficient of Mg in a semiconductor material is lower than that of Zn used conventionally as a p-type dopant. In forming the alloyed active layers 111 by diffusing Zn in the laser facet regions 113, therefore, the diffusion of Mg as a dopant from the first p-type clad layer 103 to the portion of the active layer 102 located in the internal region 112 is suppressed satisfactorily.

It will easily be appreciated that, during the deposition of each of the first p-type clad layer 103, the second p-type clad layer 105, and the contact layer 106, the diffusion of the dopant from the first p-type clad layer 103 to the active layer 102 is similarly suppressed or prevented. Similar diffusion of the dopant is also suppressed or prevented during the operation of the semiconductor laser device. This reduces crystal defects in the portion of the active layer 102 located in the internal region 112 and provides the semiconductor laser device 60 according to the present embodiment with high reliability.

In the fabrication of the semiconductor laser device 60 according to the present embodiment, the diffusion of Mg as a dopant is suppressed when Zn is diffused by thermal treatment in the step shown in FIG. 7B. Accordingly, the doping concentration of the first p-type clad layer 103 can be set to a high value. This suppresses the overflow of electrons and provides a red semiconductor laser device capable of performing a high-output operation at a high temperature.

In the semiconductor laser device 60 according to the present embodiment, the portion of the current block layer 104 located in each of the laser facet regions 113 is formed with an opening 121, as shown in FIG. 6. Moreover, Zn diffused in each of the laser facet regions 113 has lowered the resistance of the entire laser facet region 113. As a result, a leakage current which does not contribute to laser oscillation may flow in the laser facet region 113 through the opening 121.

To prevent this, there may be adopted a structure in which the opening 121 is not formed in either of the portions of the current block layer 104 located in the laser facet regions 113, i.e., only the portions of the current block layer 104 located in the laser facet regions 113 are formed to cover up the second p-type clad layer 105. A description will be given to the structure.

Figure 9A:
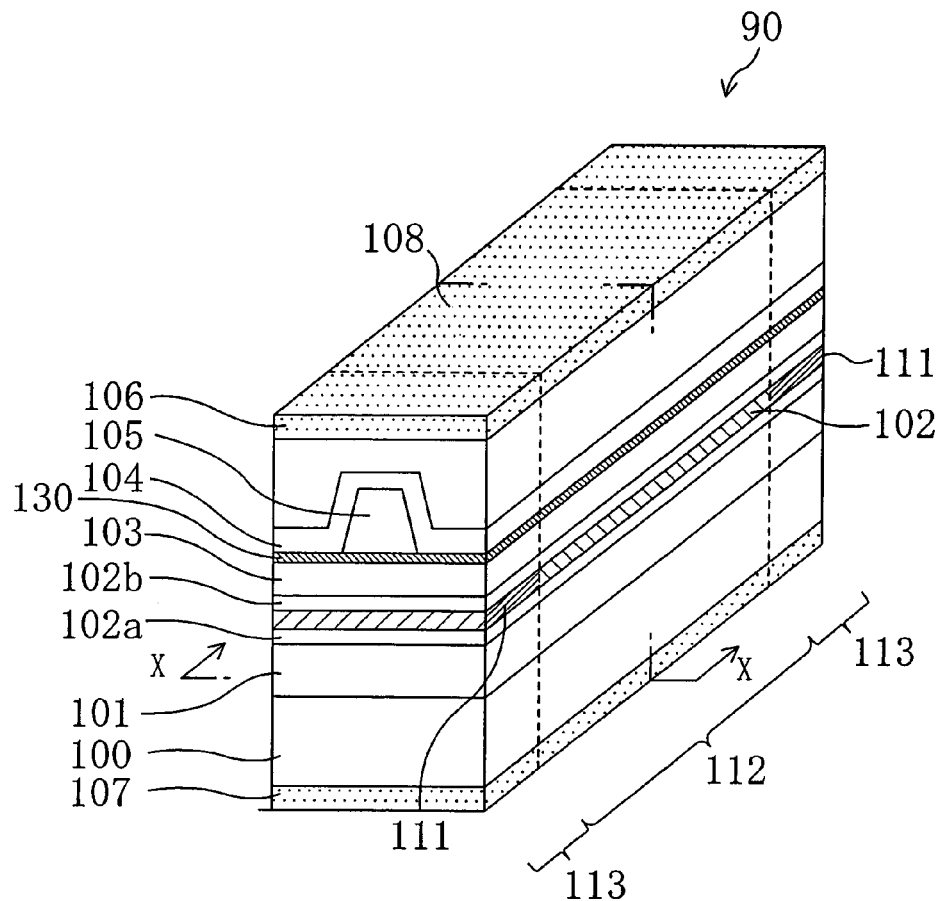
FIG. 9A is a perspective view showing a structure of a semiconductor laser device.
Figure 9B:
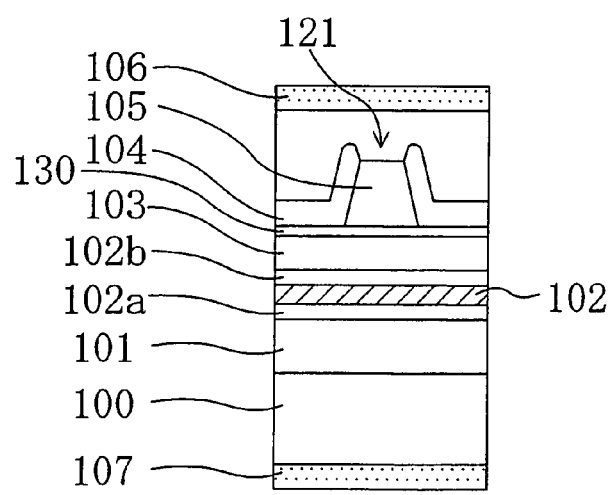
FIG. 9B is a cross-sectional view taken along the line X—X shown in FIG. 9A.
Figure 10:
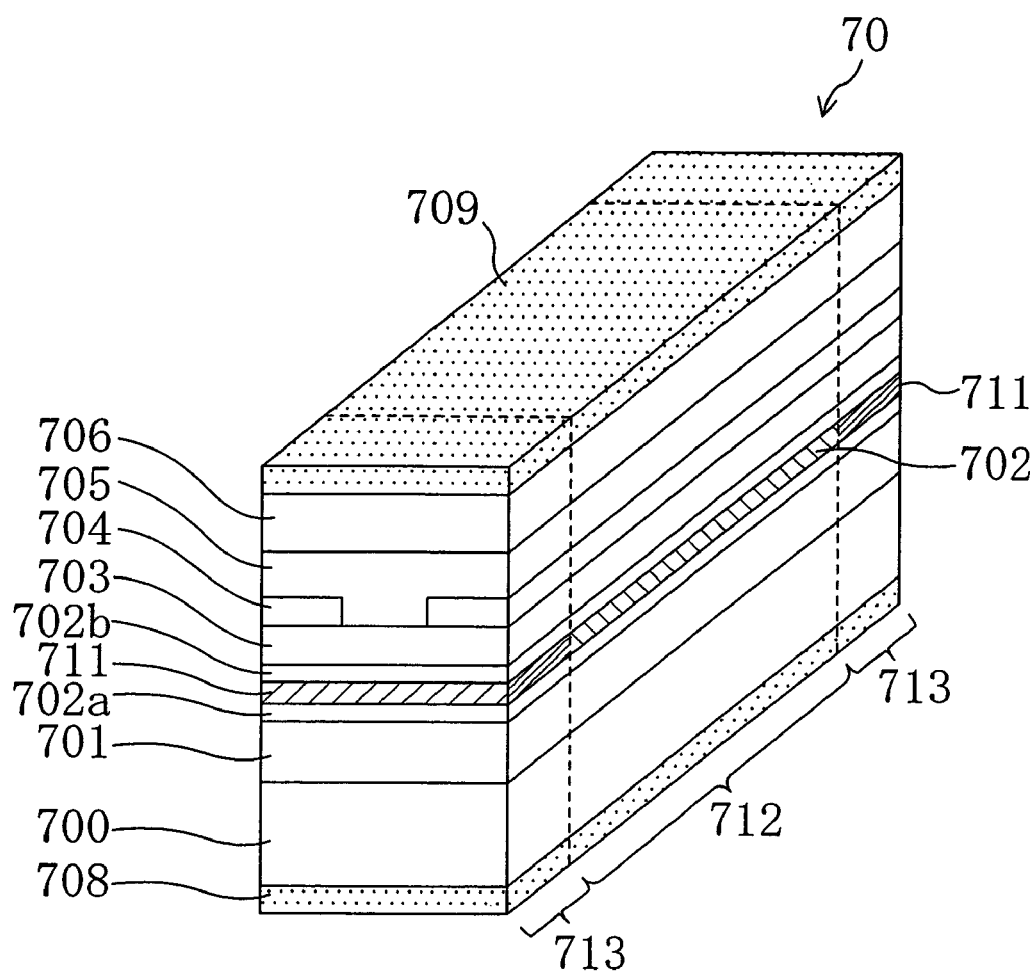
FIG. 10 is a perspective view showing a structure of a conventional semiconductor laser device.
Figure 11:
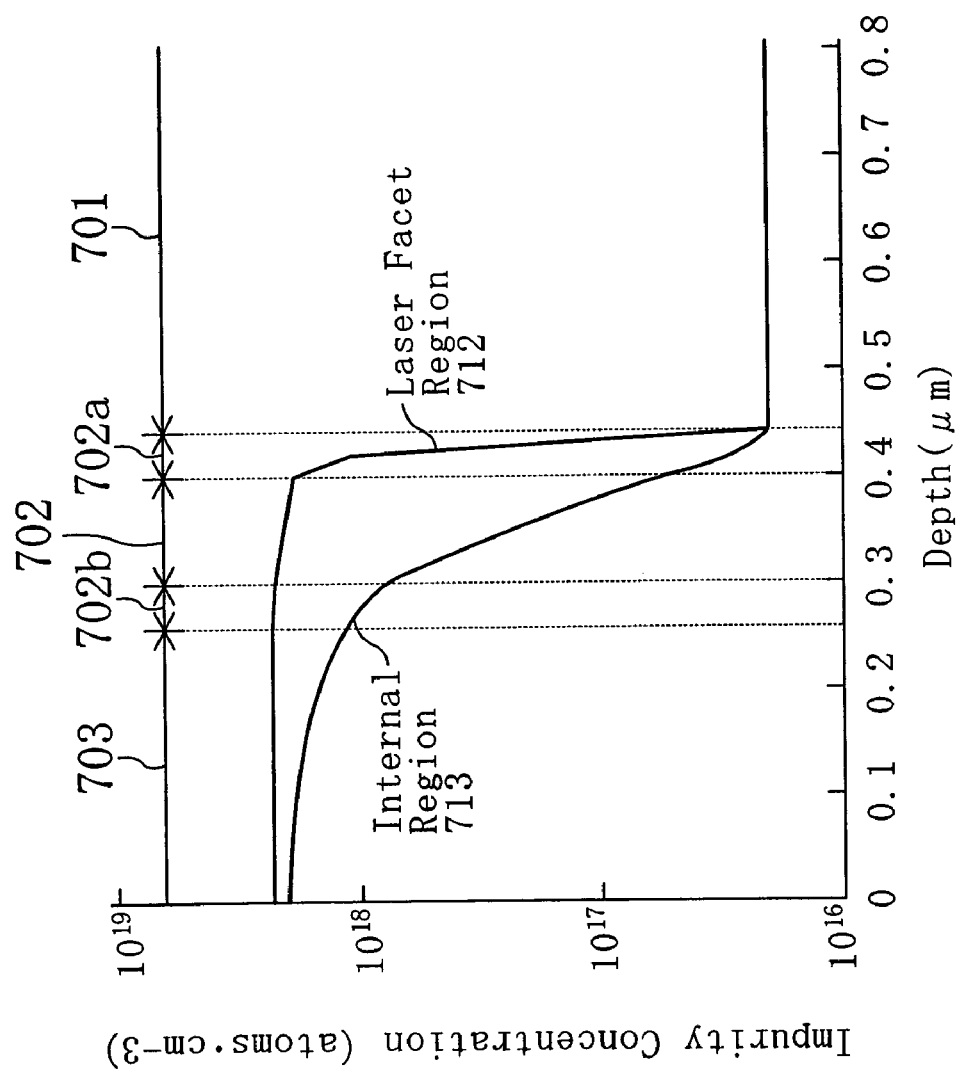
FIG. 11 shows a SIMS profile obtained from a conventional semiconductor laser device.

FIG. 9A is a perspective view showing a structure of a semiconductor laser device 90. FIG. 9B is a cross-sectional view taken along the line X—X shown in FIG. 9A.

As shown in FIG. 9A, the semiconductor laser device 90 has nearly the same structure as the semiconductor laser device 60. As shown in FIG. 9B, the internal structure of the semiconductor laser device 90 is exactly the same as that of the semiconductor laser device 60 so that the current block layer 104 is formed with the opening 121. As shown in FIG. 9A, the semiconductor laser device 90 is different from the semiconductor laser device 60 in that only the portions of the current block layer 104 located in the laser facet regions 113 are formed to cover up the second p-type clad layer 105.

Since the portions of the current block layer 104 located in the laser facet regions 113 are formed to cover up the second p-type clad layer 105, a leakage current is prevented from flowing in the laser facet regions 113.

Figure 8B:
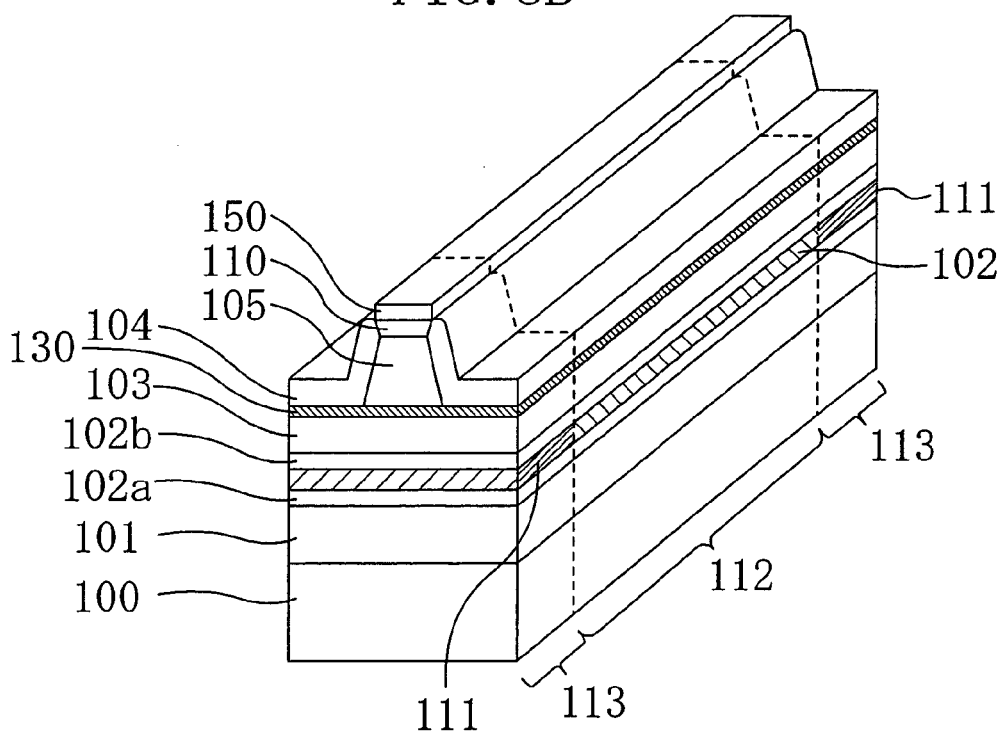

A method for fabricating the semiconductor laser device 90 is nearly the same as the method for fabricating the semiconductor laser device 60 except in that the portions of the cap layer 110 and the SiO$_2$ mask 150 located in the laser facet regions 113 are removed immediately before the step shown in FIG. 8B.

If the portions of the cap layer 110 and the SiO$_2$ mask 150 located in the laser facet regions 113 are removed immediately before the step shown in FIG. 8B, the portions of the current block layer 104 located in the laser facet regions 113 are formed to cover up the second p-type clad layer 105.

Although the present embodiment has thus described the semiconductor laser device having the window structure, the semiconductor laser device may also be constructed without the window structure (i.e., without the laser facet regions 113).

Even if the semiconductor laser device is constructed without the laser facet regions 113, the use of a material having a diffusion coefficient lower than that of Zn, such as Mg, as the p-type dopant also suppresses or prevents the diffusion of the dopant from the first p-type clad layer 103 to the active layer 102 during the deposition of each of the first p-type clad layer 103, the second p-type clad layer 105, and the contact layer 106 in the same manner as in the semiconductor laser device 60 according to the present embodiment.

Since the diffusion of the dopant from the first p-type clad layer 103 to the active layer 102 is suppressed or prevented in the semiconductor laser device constructed without the laser facet regions 113, the doping concentration of the first p-type clad layer 103 can be set to a high value in the same manner as in the semiconductor laser device 60 according to the present embodiment. This suppresses the overflow of electrons and provides a red semiconductor laser device capable of performing a high-output operation at a high temperature.

What is claimed is:

1. A method for fabricating a semiconductor laser device, the method comprising the steps of:
    (a) preparing a semiconductor substrate having a first region and a second region adjacent to the first region;
    (b) depositing an active layer made of a compound semiconductor over the first and second regions;
    (c) depositing, on the substrate, a first clad layer made of a compound semiconductor containing a dopant; and
    (d) diffusing, into a portion of the active layer located over the second region, an impurity having a diffusion coefficient which is higher than that of the dopant to alloy the portion of the active layer located over the second region.

2. The method of claim 1, further comprising the steps of:
    (e) after the step (c), depositing a current block layer made of a compound semiconductor on the substrate;
    (f) forming an opening configured as a stripe in the current block layer; and
    (g) depositing a second clad layer made of a compound semiconductor on the substrate.

3. The method of claim 1, further comprising the steps of:
    (h) after the step (c), successively depositing, on the substrate, an etching stop layer and a second clad layer made of a compound semiconductor;
    (j) after the step (d), forming a mask having an opening on the second clad layer;
    (j) removing a portion of the second clad layer located in the opening by using the mask to expose the etching stop layer in the opening; and
    (k) forming a current block layer made of a compound semiconductor on the substrate.

4. The method of claim 1, wherein the impurity is Zn.

5. The method of claim 1, wherein the dopant is Mg.

6. The method of claim 1, wherein the impurity is Zn and the dopant is Mg.

* * * * *